United States Patent [19]
Wiech, Jr.

[11] Patent Number: 5,271,887
[45] Date of Patent: Dec. 21, 1993

[54] METHOD OF FABRICATING COMPLEX MICRO-CIRCUIT BOARDS, SUBSTRATES AND MICROCIRCUITS AND THE SUBSTRATES AND MICROCIRCUITS

[75] Inventor: Raymond E. Wiech, Jr., San Diego, Calif.

[73] Assignee: Witec Cayman Patents, Ltd., Cayman Islands,

[21] Appl. No.: 35,948

[22] Filed: Mar. 23, 1993

Related U.S. Application Data

[60] Division of Ser. No. 616,489, Nov. 21, 1990, which is a division of Ser. No. 214,796, Jul. 5, 1988, Pat. No. 4,994,215, which is a division of Ser. No. 784,454, Oct. 4, 1985, abandoned, which is a division of Ser. No. 665,507, Oct. 30, 1984, Pat. No. 4,562,092, which is a continuation of Ser. No. 445,017, Nov. 29, 1982, abandoned, which is a continuation-in-part of Ser. No. 174,929, Aug. 4, 1980, Pat. No. 4,374,457.

[51] Int. Cl.[5] .................. C04B 38/06; C04B 41/89
[52] U.S. Cl. ...................... 264/61; 264/62; 264/63
[58] Field of Search ................ 264/61, 62, 63

[56] References Cited

U.S. PATENT DOCUMENTS

| | | | |
|---|---|---|---|
| 4,189,760 | 2/1980 | Marshall | 264/61 |
| 4,234,367 | 11/1980 | Herron et al. | 156/89 |
| 4,289,719 | 9/1981 | McIntosh | 264/61 |

*Primary Examiner*—James Derrington
*Attorney, Agent, or Firm*—Jay M. Cantor

[57] ABSTRACT

A substrate and method of manufacture wherein a substrate is molded from particulate material wherein grooves on and through the body are formed during substrate molding and prior to sintering. The substrate includes all buss structure molded therein. Cooling of chips is provided by providing a heat sink in grooves formed within a substrate and beneath the chips. Microcircuits are formed by disposing on the substrate and interconnecting via buss structures on the substrate various semiconductor dies with encapsulation of some or all of the substrates and components thereon, if desired. In addition, connection from the board to external circuits is available by means of an edge connector.

4 Claims, 2 Drawing Sheets

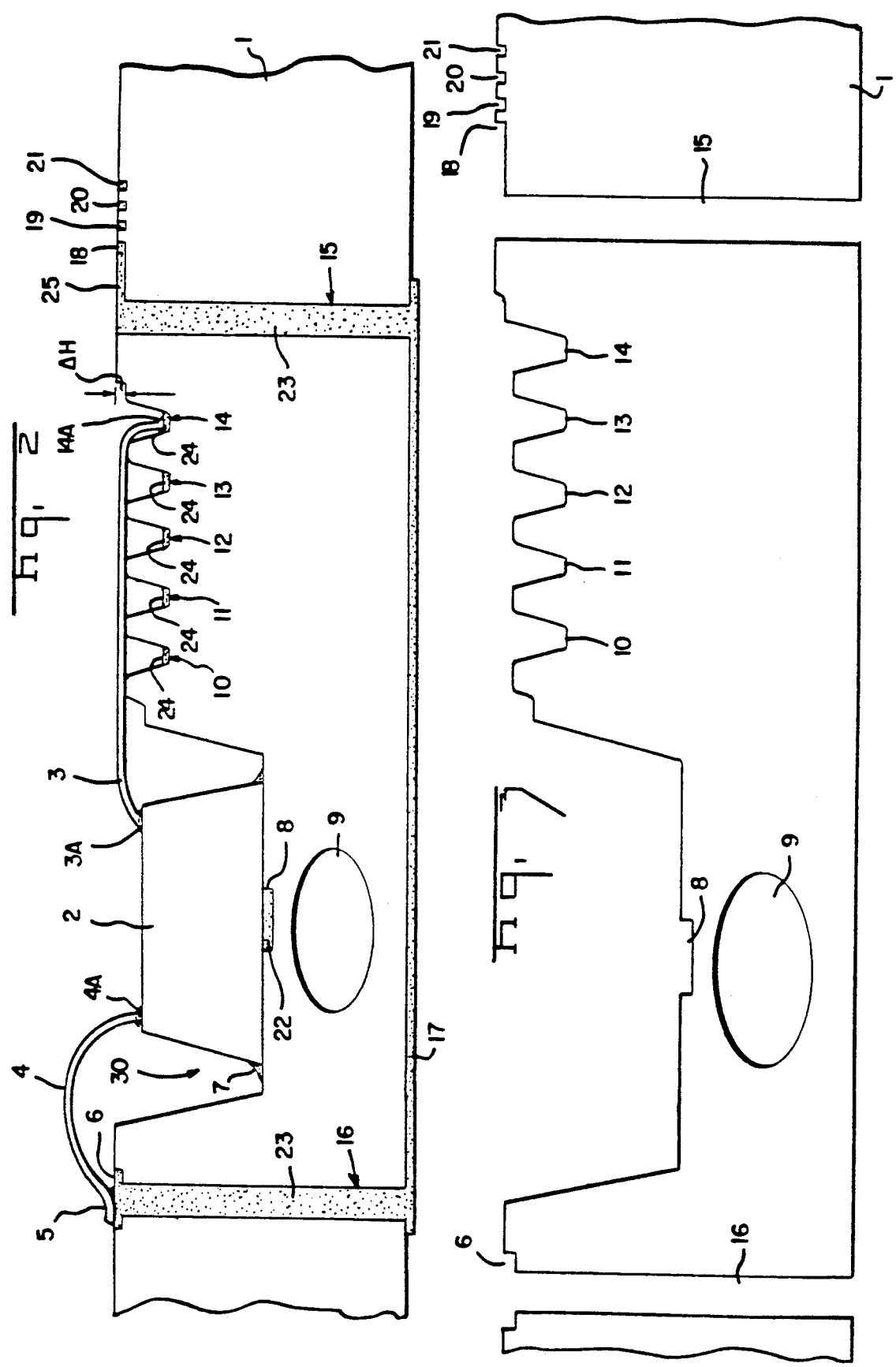

METHOD OF FABRICATING COMPLEX MICRO-CIRCUIT BOARDS, SUBSTRATES AND MICROCIRCUITS AND THE SUBSTRATES AND MICROCIRCUITS

CROSS REFERENCE TO RELATED APPLICATIONS

This application is a division of Ser. No. 07/616,489, filed Nov. 21, 1990, which is a division of Ser. No. 07/214,796, filed Jul. 5, 1988, now U.S. Pat. No. 4,994,215, which is a division of Ser. No. 06/784,454, filed Oct. 4, 1985, now abandoned, which is a division of Ser. No. 06/665,507, filed Oct. 30, 1984, now U.S. Pat. No. 4,562,092, which is a continuation of Ser. No. 06/445,017, filed Nov. 29, 1982, now abandoned, which is a continuation-in-part of Ser. No. 06/174,929, filed Aug. 4, 1980, now U.S. Pat. No. 4,374,457.

BACKGROUND OF THE INVENTION

1. Field of the Invention

This invention relates to the fabrication of complex microcircuit boards and substrates, complex semiconductor circuits using the microcircuit boards and substrates and methods of producing same.

2. Description of the Prior Art

The art of forming shaped articles from particulate mixtures is well known. Classically a desired particulate material is mixed with a binder and then formed into the desired shape, this being called a green body. The green body is then fired to provide a fusion of the particulate material and drive off the binder, thereby producing the desired shape product with proper surface texture, strength, etc.

In the production of micro-electronic substrates in the manner above described, it has been a practice to mix the particulate material, usually ceramic, and a thermoplastic binder system together and cast the mixed system onto a moving belt. The cast mixture is then adjusted to a given thickness by the use of a scraper or doctor blade. The green ceramic material, thus doctor bladed to a given desired thickness, is usually permitted to evaporate out a portion of the thermoplastic binder and the green dried sheet is then cut into desired lengths for further processing.

The green ceramic sheets thus formed have had a considerable amount of effort and cost expended in maintaining them to a specific thickness and every effort is also expended to maintain the sheets throughout their processing in a configuration in which the surfaces are as flat and parallel as possible. In subsequent manufacturing steps, alterations are made to this thin, flat, parallel-faced geometry by such techniques as punching holes through the green ceramic, laser scribing the green ceramic to cause depressions in the green ceramic, the passage of the green ceramic beneath a saw or grinding wheel to scribe or machine a configuration onto its surface and other techniques that are very well and thoroughly described in the literature of this art.

Subsequently, additional coatings are applied to the ceramic by one of several well known techniques, such as silk screen printing on to the flat surfaces of the ceramic substrate. In any case, the accepted practice starts with a ceramic substrate which is manufactured in a controlled flat configuration and is subsequently worked by a machining or other mechanical manufacturing process to alter the surface configuration to something other than a flat surface. As the green ceramic is quite delicate, the degree to which the flat, as formed, surface can be mechanically altered into a complex three dimensional configuration is severly limited and the ability to closely control the geometry of the holes is also severely limited.

In a complex hybrid substrate in which a great many components, both active and passive, are located on the substrate and interconnected to each other and to the outside world, the interconnection problem is extremely severe. Many components that are affixed to the substrate, such as micro-electronic circuits and transistors, are interconnected with the conductive paths formed on the substrate by means of fine wires which are welded to sensitive areas, termed pads, on the transistors or micro-electronic circuits and terminated on the substrate by another weldment to a conductive area on the surface of the substrate. The wires that are utilized for these complex interconnections are extremely fine on the order of magnitude of 0.0254 millimeters in diameter. Frequently due to the interconnection requirements of the particular hybrid circuit, the wire must pass over another conductive path usually, though, not necessarily limited to a metallized region on the substrate. When this is necessary, what is usually done is to provide, through multiple silk screening and firing techniques, an insulating layer that separates the two conducting paths so that a short circuit will not occur at the region of cross over.

Another problem prevalent in conventional substrate manufacture is that when the prepared substrate is fired, the shrinkage due to sintering is not uniform and not totally predictable When the non-uniformity of the shrinkage of the substrate exceeds the tolerance limits of the subsequent silk screen printing operation on the surface of the substrate, it becomes impossible to register the printing on the substrate with any through holes that may exist on the substrate. This effect places a limitation on the size of the circuit being fabricated as any arbitrarily small size must be within the limits of these two independent manufacturing steps.

Another limitation found in conventional high density microcircuit boards and substrates is the dissipation of the heat generated in the high density packaged components in that the heat generated by placing components closer and closer together becomes progressively more difficult to dissipate and get away from the surface as the circuit density increases. The conventional solution to this problem is to employ a substrate material that has the highest possible thermal conductivity. This is generally beryllium oxide which is generally considered to be highly toxic.

A yet further problem inherent in prior art multiple layer ceramic substrates is the fact that the green substrate surfaces are not flat after the thick film material has been applied to that surface because the thick film material provides a ridge above the surface and, for that reason, when the "green" substrates are layered, one atop the other with conductive patterns therebetween and pressure is applied to the multilayer "green" substrate, excessive stresses are set up that result in low fired yields of the sintered multilayer substrate.

A still further problem is that, in thick film devices, as the conductor dimensions become progressively smaller, the cross-section geometry of the applied conductor layer becomes less predictable as it is applied as a silk screen ink in thick film technology. Thus, the distributed circuit constants such as inductance and capacitance have a wide range of unpredictable values from substrate to substrate and, in circuits that are critical to these parameters, they must be individually trimmed after manufacture. If the thin conductor is buried in a multiple layer configuration, the post sintering trimming becomes impossible.

BRIEF DESCRIPTION OF THE INVENTION

The size reduction, packing density, heat dissipation, conductor geometry and complex interconnection problems are substantially reduced or overcome in accordance with the present invention. Briefly, the green body from which the substrate is fabricated is formed by mixing together into a homogeneous mass ceramic particulate material and a thermoplastic binder. The ceramic-binder mixture is caused to flow into a mold or die cavity under heat and pressure. The die cavity can contain all of the desired configuration including three dimensional configuration of the surfaces, the geometry of all surfaces, all through holes, conductor geometry and any side holes. The molded substrate may then be introduced into another mold cavity and have subsequent shots of material, not necessarily of the same composition, which can be electrically conductive, insulative or whatever is appropriate mated to it in the green state. It may be desirable to mechanically work the molded green substrate between molding operations by adding or subtracting material therefrom. After the desired green molded configuration has been built up, including multilayer laminated configurations, the molded substrate then has the thermoplastic binder material removed and is sintered to its final dense configuration in accordance with prior techniques as set forth, for example, in Strivens 2,939,199, Wiech 4,197,118 or Wiech 4,305,756.

After sintering, it may be desirable to apply electrically conductive material to the bottom of certain grooves molded into the substrate and/or fill other grooves that have been molded into the substrate or over or above the grooves with electrically conductive or other appropriate material, or run conductive material above the tops of grooves with or without interconnection from groove to groove. In general, those grooves, which have electrically conductive material applied only to the bottoms of the grooves will be part of buss structures and will have highly configured grooves that have been formed to accept various standard bonding tools. Other grooves that are intended primarily to be used as conductive paths will be much smaller and shallower, though a considerable third dimension will be apparent in these grooves. These conductor grooves are placed on the uppermost plane of the substrate or the lowermost plane of the substrate or both. The buss structure grooves will consist of a series of parallel grooves with essentially a corrugated-like appearance. A wire bonded to the conductive material in the bottom of one of these buss structure corrugated grooves that is brought across the buss structure to a termination point cannot short circuit to the conductive material at the bottom of adjacent or other grooves over which the conductor passes due to the geometry that has been molded into the surface. The result is that it is not necessary for the provision of special non-conducting areas to separate conductors that are crossing each other in this configuration. The conductors that have been placed in the groove in the uppermost surface of the substrate can be fabricated as fine as technology permits and, since they are an integral portion of the surface configuration of the substrate, they will always run between two arbitrary points on the substrate, irrespective of the possible non-uniformity in shrinkage, as they are molded as a portion of the substrate and not subsequently printed onto the substrate. These conductors will substantially fill the entire groove up to the substrate surface.

Raised conductors are fabricated by molding raised structures and metallizing the uppermost portions of these structures. Raised structures can be terminated in geometrical configurations that match the pad areas on semiconductor chips so that the chips can be bonded directly to the substrate by the practices employed in "flip-chip" bonding techniques. Such raised conductors can be disposed on the substrate surface and/or in depressions in the substrate.

Holes with axes that are molded substantially parallel to the surface of the substrate can be employed as coolant passages so that active or passive cooling can be readily accomplished, thereby minimizing the heat dissipation problem.

In addition, semiconductor ships can be sandwiched between sintered substrates with conducting paths on facing sides of an adjacent pair of substrates contacting conductive pads on one or more semiconductor chips mounted between the substrates.

In the event semiconductor chips are already on a substrate, the adjacent substrates are joined by an epoxy or other appropriate joining agent for ceramics. In the event the substrate does not contain materials adversely affected at the ceramic sintering temperature, plural substrates can be mounted in intimate contact with each other to provide joining of adjacent substrates by sintering of the ceramic material between adjacent substrates. Cooling or heat removal caused by heat producing components can take place by means of a heat sink material disposed in holes in the substrates adjacent the chips. For example, the holes could be internally configured as a heat pipe and freon could be passed through the holes in a closed heat pipe circuit within the substrate to conduct the generated heat to a heat sink region. In this way, heat can be removed from above and/or below and/or along the sides of chips and conductive paths can also contact pads on single chips simultaneously from two different substrates. Bumps, as noted above, can also be placed on one or more substrates. A cooling medium can also be passed between adjacent substrates, the medium merely requiring the properties of being a heat sink.

BRIEF DESCRIPTION OF THE DRAWINGS

FIG. 2 is a view taken along the line 2—2 of FIG. 1; and

FIG. 3 is a view as in FIG. 1 but prior to firing.

DESCRIPTION OF THE PREFERRED EMBODIMENTS

Figure 1:
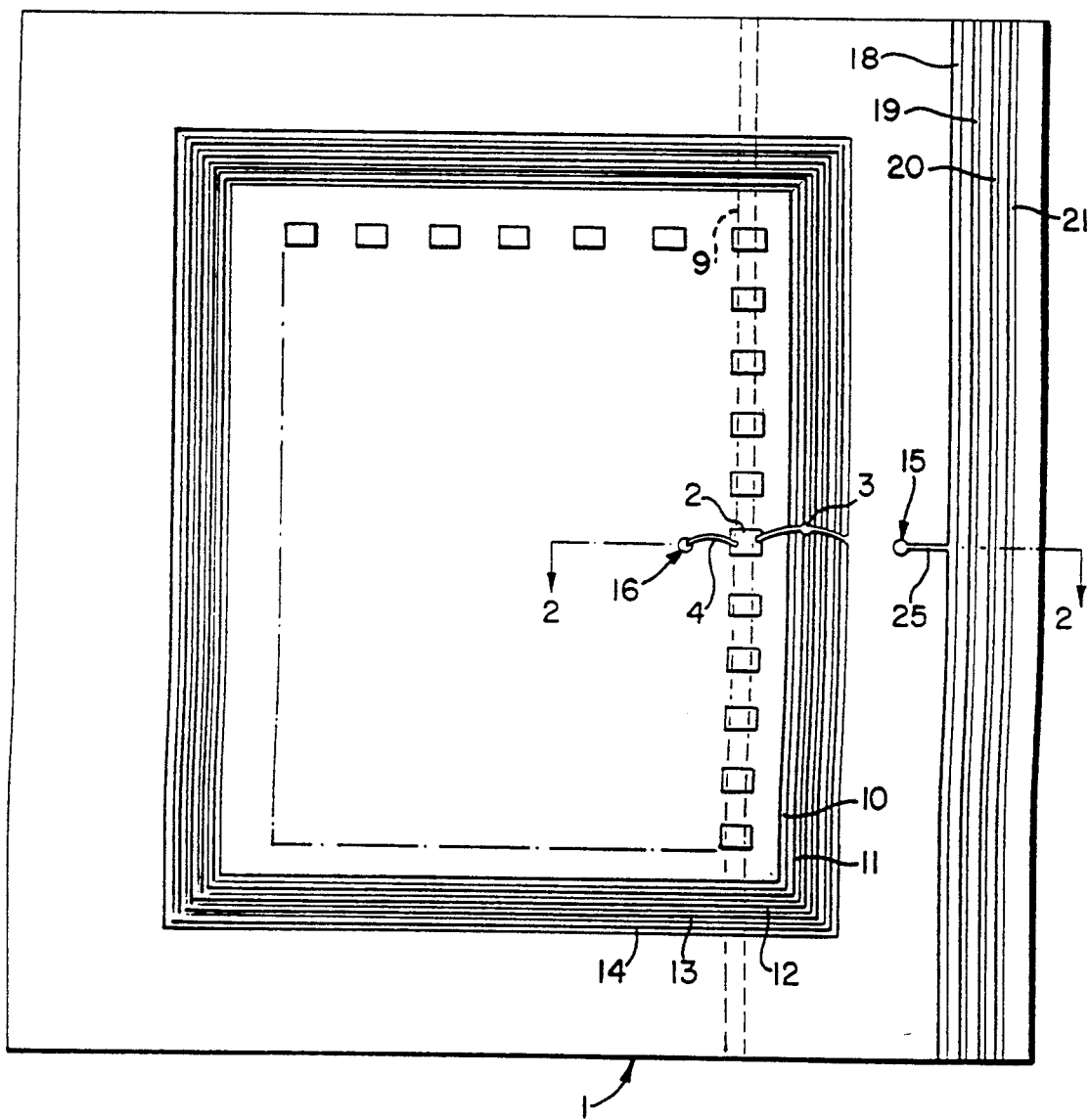
FIG. 1 is a top view of a preferred embodiment of the present invention.

At the outset, it should be understood that while the discussion of the specific embodiments of the invention will be provided mainly with reference to ceramics, parts of the invention also apply to metals, plastics, and any other materials that can be made to be moldable. In the manufacture of complex microcircuit boards and substrates, it has been necessary in the prior art that these parts undergo precision machining and/or printing operations in order to provide the final article with the desired characteristics. In accordance with the prior art, the formability limitations and the requirement for independent tolerancing limited yields and complexity of the desired final articles. In accordance with one aspect of the present invention, ceramic materials can now be molded directly from particulate material to provide the precision finished product without the necessity of machining and substantially reducing other costly processing steps.

FIGS. 1 and 2 present a preferred embodiment of the invention. With reference to FIGS. 1 and 2 there is shown a portion of a substrate 1, preferably of aluminum oxide. Element 2 is a semiconductor micro-electronic device, commonly referred to as a die or chip, which has been attached to substrate 1 in well 30 formed in the substrate with chip attachment material 7 which is known in the art. The chip is in electrical contact with conductive material 22 located in the via 8 which forms a power connection to the chip. The chip is located adjacent to through hole 9 which is a molded internal cooling passage of a desired geometry, not necessarily circular, and passes entirely through the substrate though it need have only one outlet. Through holes 15 and 16 pass entirely through the substrate from top to bottom surfaces and have been filled with conductive material 23 to offer electrically conductive paths from one surface of the substrate to the other. Conductor 17 has been silk screened onto the substrate and connects the conductive material of hole 16 to that of hole 15. Conductor 17 could also be disposed in a groove formed in the substrate during molding. Pad area 6 has been molded into the top side of the substrate and has been filled with conductive material 23. The buss structure shown consists of grooves 10, 11, 12, 13 and 14. These grooves have been dimensioned and contoured to accept a bonding tool that welds wire 3 to the conductive material 24 at the bottom of groove 14 at the weldment shown at location 14a. The other end of wire 3 is shown welded to chip 2 at location 3a. Wire 4 is shown welded to chip 2 at location 4a and to pad 6 at location 5. It is seen that wire 3 crosses the conductive material in the bottom of grooves 10, 11, 12 and 13 and is supported and maintained away from the conductive pads by the material separating the grooves. Thus, the need for applying an insulating layer covering the conductive material 24 is obviated and connections to the grooves of the busses may be run across the buss structure without possibility of short circuit. Alternatively, bonding pads can be placed at predetermined locations between the grooves 10 through 14 for bonding of the wire 3 thereto for additional mechanical rigidity. The buss structure groove material 24 at its highest point of elevation, is located a small distance ΔH below the topmost plane of the structure. Grooves 18, 19, 20 and 21, on the other hand have been filled with conductive material to the topmost plane of the structure with a connection 25 shown running from hole 15 to conductor 18. Conductive material could, alternatively, be disposed on a raised portion or portions in the well 30 and such raised conductive portions could be disposed about the floor and/or sides of well 30 for connection to pads on chip 2 in the form of a lead frame. The raised configuration could also be replaced by vias with conductive material in the floor and/or sides of the well 30.

Referring now to FIG. 1, the top surface of the substrate with semiconductor chips connected thereon is shown. The chips 2 are bonded to the substrate along the perimeter of a rectangle with connections being made from chip pads to busses 10, 11, 12, 13 and/or 14 via wire 3, connection to buss 14 being shown. A lead 4 is also connected from a pad on chip 2 to the conductive material 23 in hole 16. A buss 25 is connected between conductive material 23 in hole 15 and buss 18. A channel 9 positioned in the substrate just below the chips 2 is shown in phantom. The channel 9 can be provided along the x and/or y axis and there can be several to remove heat from all chips and other heat producing elements on the substrate as will be explained.

FIG. 3 shows the green substrate as molded that is shown in its fired and final assembled version in FIG. 2. Note the difference in the scale factors.

The mold or die required to form the final configuration must be scaled up from the dimensions of the final configuration by approximately 20 percent, i.e., the final desired dimensions must be multiplied by approximately 1.2 to determine the mold dimensions. The exact scaling factors involved are highly dependent upon the specific formulations and processing techniques utilized. The shrinkage in processing and sintering however is quite isotropic, so that all dimensions shrink very nearly to the same scale factor. The isotropic nature of the shrinkage insures that the angles maintained are very nearly identical in the green and fired article. The molding material employed here typically would be approximately 60% by volume of a fine grain aluminum oxide which has been milled to its ultimate crystal size and 40% by volume of a thermoplastic binder mixture. A typical formula for the thermoplastic binder mixture would be approximately one-third by weight of polyethylene, one-third by weight of paraffin wax, one-third by weight of beeswax with perhaps 0.1 through 0.2 percent of stearic acid added. The thermoplastic materials and aluminum oxide are mixed and blended together to a homogeneous mass at a temperature in excess of the melting point or flow point of the thermoplastic materials. Techniques for producing thermoplastic molding mixtures are well described in the prior art and will not be elaborated on here.

The cooled green molding material is crushed to pellet size or otherwise pelletized and is employed as a feed material for a substantially conventional plastic injection molding machine that has been suitably modified to accept abrasive materials.

The mold is constructed preferably of ceramic, though metal and cermets can also be used, by techniques and principals well known in the art of plastic injection molding.

The vias 10 through 14 and 18 through 21 in the final mold may be of such small cross section that they cannot be accurately and properly formed in the mold by standard or known mold-making techniques. One novel method of accurately forming such vias in the final mold is to produce a first mold with all geometry multiplied in size by a predetermined factor so as to permit formulation of the vias by standard or known mold-making techniques. A second mold is then formed from the first mold by the techniques described above and in the above noted patents for forming substrates except that metal rather than ceramic is preferably used. This second mold will be a negative of the first mold, but reduced in size uniformly throughout by about twenty percent. A third mold is then made in the same manner as the second mold from the second mold which is a negative of the second mold and again reduced in size by about twenty percent. This procedure is continued until a substrate mold of the desired size results. There is substantially complete replication of the molds from step to step in reduction.

The holes 9 are formed, for example, by having an insert in the mold in the form of an electrically conductive wire of proper cross section and located where the holes are to be formed. When the green body is formed, the molded part with wire is removed from the mold and the wire is heated sufficiently to melt the binder immediately therearound and permit axial removal of the wire, thereby leaving the hole 9 in the green substrate in the region where the wire had been.

Other methods of forming holes include placing an extractable material in the substrate at the location wherein the hole is to be located. For example, a length of nylon 612 can be used by placing it in the mold as an insert and the ceramic material is molded around the nylon, encasing the nylon totally except for one or more exits to the substrate surface. The ceramic binder is designed to be inert to formic acid whereby the nylon 612 can be later removed from the "green" substrate by dissolving it in formic acid. The insert could also be a material which burns away during sintering without adversely affecting the remainder of the substrate. This is essentially a "lost wax" casting process type of operation. It should also be noted that the hole 9 can have any shape desired such as serpentine or the like. The important feature is that the hole be located as close as possible to all heat producing components disposed on the substrate.

Subsequent manufacturing steps for specific devices and specific substrates may vary widely at this point. However, it is to be clearly understood that, irrespective of the variations in manufacturing steps and procedures that may take place at this point, at least a single molding operation has occurred and that the substrate may be reinserted into different cavities and subsequently may have an additional layer or layers of the same or different materials compatible with the end objective of the substrate molded on or into or through the substrate. The number of combinations and permutations possible at this point is very great and anyone skilled in the art will be well aware of the number of possibilities that exists to them to manufacture the desired end item. Enumerating such possibilities would not materially contribute to the description of this invention and for the purposes of this description it will be assumed that no additional steps will be taken between the molding and firing of this particular device. However, a list of possible operations that could be employed during this green phase, though by no means complete, would include the following possibilities: (1) machining, (2) silk screen printing, (3) coating with resist and exposing, (4) filling grooves and vias, (5) laminating, (6) thermal welding, (7) thin film deposition, (8) plating.

Sintering of the substrate is accomplished in two distinct steps. First, the thermoplastic binder must be removed from the substrate. This is conveniently accomplished by slowly heating the substrate at a low pressure to evaporate or sublime thermoplastic material out of the substrate body as described by Strivens, however other methods such as described in the above listed patents are equally appropriate. Second, the substrate is then sintered with a sintering schedule and sintering atmosphere that is compatible for all the materials included in the substrate. If, for example, during substrate fabrication, a molybdenum metal face had been screened onto the green substrate at some portion of the manufacturing process, then the sintering atmosphere would best be reducing in nature. However, if the entire substrate is composed of an ceramic oxide such as alumina, then the sintering is most conveniently performed in an air atmosphere. Beneficial us of sintering atmosphere is well known in the art.

The next step in the manufacture of the subject circuit is to apply the metallization to the desired locations in and on the substrate. The techniques employed to do this are well known in the art and the examples presented here are typical approaches that would be taken to achieve this objective. Grooves or vias 18, 19, 20 and 21 are most conveniently metallized by spreading or doctor blading an electrically conductive metal glass frit composite slurry or paste such as is used for silk screen printing across the groove area, thereby filling the grooves.

The metallizing paste is dried and the substrate fired in accordance with the procedure required for the particular metallizing paste employed. As the groove structure under consideration here is located in the uppermost plane of the substrate, the metallizing paste that is bridging the gaps and spread about on the substrate surface in undesirable locations is most conveniently removed by mechanically abrading or lapping the uppermost surface. If the substrate is applied directly to the lap, only the uppermost plane comes into contact with the lap, thereby removing any material on that plane. In this manner the conductor grooves are filled with a metallized material which has assumed the geometry of the grooves. Through holes 15 and 16 are filled with the same pass of metallizing paste as was employed in the filling of grooves 18, 19, 20 and 21. At this time bonding pad 6 is also filled and bonding pad 6 is lapped back during the clean up operation that was employed to clean the regions surrounding the grooves 18, 19, 20 and 12. Conductor 17 is applied in this example most typically by silk screening the metallizing paste so that a conductive path between the hole ends of holes 16 and 15 are joined by metallizing material. The bottoms of grooves 10, 11, 12, 13, 14 and groove 8 are most conveniently filled with well known electrically conductive paste utilizing an inking pen of small bore capillary tubing. To insure the separation of conductive material between the grooves, it may be desirable to coat the upper sections of the grooves with a non-wetting wax resist which is most conveniently applied by a roller. While the conductive paste is in its green form, it may be conveniently tested for continuity and interconductor short circuits and repaired at this time prior to firing. In order to set the conductive material in its place, the substrate is fired at an elevated temperature with a time temperature atmosphere profile that has been established for optimum firing conditions for the paste being employed. It is obvious that a multiplicity of pastes and firing schedules may be employed for specific purposes, such as to apply resistant pads. It is apparent that the conductive paste can be applied to the "green" substrate and fired in the same step as the sintering of the "green" debinderized substrate or it can be applied to the substrate after it has been fired or sintered, thereby requiring a further firing step. It is also apparent that other sinterable materials can be positioned on the "green" substrate, such as resistive, insulative or the like. For example, materials resulting in piezoelectric devices after sintering can be deposited on the substrate or in grooves thereon with an electric field thereacross being provided by conductors in adjacent grooves. Also, resistors, capacitors and other such components can be formed.

An alternate procedure for applying conductive paths at preselected locations on the substrate, either before or after firing or sintering of the substrate is by use of a thermographic slurry in which the continuous phase is a thermoplastic material and the particulate phase is a combination of a glass frit and a conductive powder, in general. The slurry is solid at ambient temperature and a liquid at a predetermined temperature above ambient. With the slurry in the liquid state, it is applied to an inking type device, such as a rubber stamp, wherein the pattern on the stamp is heated to permit the slurry to be deposited on the pattern in the liquid state. The pattern takes the shape of the conductive pattern to be deposited on the substrate. The stamp is then properly lined up with the substrate and the pattern then comes into contact with the substrate to deposit liquid slurry thereon. The stamp type device is removed from the substrate, leaving the liquid slurry thereon in the pattern configuration. The substrate is maintained at a temperature below the hardening temperature of the slurry whereby the slurry hardens on the substrate in the shape of the pattern. The thermoplastic material is then removed by known debinderizing techniques, such as described in the above noted patents. The remaining glass frit and metal powder is fired either during substrate sintering if placed on a "green" substrate or as a separate step if placed on an already fired substrate to provide adherence of the glass frit-electrically conductive metal conductor to the substrate.

The stamp type device can have either a flat pattern thereon or a three dimensional pattern whereby the "ink" thereon can be deposited in grooves or wells formed in the substrate. For example, the pattern deposited could extend along the side walls and/or bottom of the well 30 in FIG. 2.

The stamp type device can be of any material capable of having a pattern formed on a face thereof and being wetted by the "ink". Preferably the pattern is heated as noted above. However, the pattern need not be heatable and can still be used as long as the "ink" is maintained in the liquid state up to the time of pattern removal from the substrate. This can be accomplished by heating the slurry or "ink" to a sufficiently high temperature initially.

The slurry or "ink" if designed to be electrically conductive, is composed of a glass frit of the type used in silk screen techniques an electrically conductive metal powder such as standard silver-palladium alloy powder, a gold or a copper alloy powder and the thermoplastic binder, such as polyethylene. The glass frit would have a low melting point (about 300° C.), be compatible with the powder and be capable of adhering to the substrate at a reasonable firing temperature above about 300° C. and below the substrate sintering temperature. About 95% to 50% by volume of metal is used and the rest glass frit to produce the powder-glass mixture. About 50% to 60% by volume powder-glass mixture is used and the rest thermoplastic binder to form the slurry. A typical binder is composed of about 0.2% stearic acid, about 90% paraffin wax and the rest polyethylene, all by volume, though other thermoplastic binders could be used.

The above noted "stamp-type" process can be used to form other types of patterns on or in the substrate. For example, the conductive powder can be replaced with a cermet, an electrically insulating material such as the glass itself, electrically resistive material, semiconductive material, such as barium titanate, or the like to form any desired pattern in or on the substrate surface. It is merely desirable that such material be in powdered form and be adherable to the substrate either alone or in combination with the glass frit.

After firing and clean up operations, the chip 2 is attached to the substrate by any one of the chip attach techniques that are well known in the art. Element 7 is shown and represents chip attach material that is unspecified in this description. Conductor 8 has a low ohmic contact to chip 2 and represents in this description a power supply lead to chip 2.

The active micro-electronics located in and on chip 2 are interconnected to the substrate through wires 3 and 4 at weldments 3a and 4a and weldments 5 and 14a as shown as well as to interconnections by wire, whether deposited onto the substrate 1 or by weldments from the chip to other ones of the conductors 10 through and 18 through 21 (not shown) to provide interconnection between chip 2 and other chips on the substrate 1 as well as to circuits external to the substrate 1. As is well known in the art, welding pad regions located at the surface of chip 2 are provided for this express purpose. The metallizing materials employed at locations 5 and 14a have been selected to be compatible with the weldment. The result is a miniaturized equivalent of a known printed circuit board with multiple interconnected semiconductor devices thereon.

It is seen that wire 3, in going from groove 14 to the pad located at 3a, crosses conductors 13, 12, 11 and 10. The dimensions of wire 3 are normally on the order of 0.0254 millimeters and the dimensions across the grooves 10, 11, 12, 13 and 14 would normally be on the order of 0.381 millimeters. The conductor 3 is preferably composed of aluminum with 1% silicon added though other conductor materials can be employed. Thus, very large unit forces would have to be applied to the wire 3 to cause it to contact the conductive material in one of the grooves across which the wire is suspended. The unit forces would be the same as if it were a one centimeter diameter aluminum bar bridging a fifteen centimeter gap.

All or part of the substrate can now be encapsulated. For example, an epoxy resin can be sprayed or otherwise coated over all semiconductor chips 2 to provide hermeticity or any other desired properties to the substrate, conductors and/or components on the substrate.

It can be seen that, for example, one or more of the chips 2 can be microprocessors and/or other complex circuits whereas still other ones of the chips 2 can be RAMs, ROMs or other types of storage device to provide a complete very miniaturized system such as a computer, control system or the like in a space much smaller than is presently known. Furthermore, these systems can be arranged as shown in FIG. 1 or, alternatively, with a further set of input, output and power busses extending to the edge of the substrate 1 for connection to a connector of known type for plug-in connection to known systems.

Cooling passage 9 is utilized to withdraw thermal energy from the chip 2 to a remote location to maintain the chip temperature within desired limits. This may be done by circulating a fluid, such as freon or air or the like through cooling channel 9 of a lower temperature than chip 2 to create a temprature differential between chip 2 and the fluid in cooling channel 9, thereby causing a heat flow from chip 2 to the fluid in channel 9 in accordance with well known thermodynamic and heat transfer principles. Use may be made of local boiling such as is found in a heat pipe to achieve very high thermal flux densities in the region surrounding the chip. These techniques are well known in the art of heat transfer and thermal energy management and are obvious to anyone skilled in this art once the availability of cooling passage 9 is presented to them.

While only a single hole 9 is shown passing under a single row of chips in FIG. 1, it should be understood that the hole 9 or holes 9 can take other configurations. For example, rather than passing from one end of the substrate to the adjacent end as shown in FIG. 1, there can also be holes in a transverse direction to pass under or along the sides chips 2 positioned from left to right as shown in FIG. 1. Also, a single hole could be formed which is in the shape of a rectangle and passes under all chips 2 shown in FIG. 1 with closely adjacent entrance and exit for heat sink material disposed at a substrate edge. The latter embodiment would require molding of the substrate in two parts with half of the hole in each part. The parts would then be held together while in the green state in the shape of the final configuration with subsequent binder removal and sintering.

In the preferred embodiment described above, the substrate material was sintered aluminum oxide. Other preferred embodiments include the use of a metallic particulate material which has been mixed with a suitable plasticizing binder and molded into the desired complex geometry. The sintered metallic substrate could then be subsequently machined as in the case of the aluminum oxide substrate, but with the additional machine techniques that require a ductile or conductive material. For example, precise configuration could be coined into the surface as an extension of a crush forming operation or complex configurations could be electrically discharge machined into the surface. In this embodiment, the substrate would then be coated with a thin layer of insulating material, such as glass. Another embodiment exists in the use of molding a highly loaded plastic system, such as a glass filled epoxy, and directly utilizing the as molded article for the interconnection structure without subsequent binder removal and sintering.

As stated hereinabove, multiple substrate layers can be formed, one atop the other. For example, two substrates of the type shown in FIG. 1 can be placed back to back in the "green" state with appropriate through holes and then sintered. Alternately, the substrate as shown in FIG. 2, but with conductor 17 disposed in a groove so that nothing extends outwardly beyond the bottom surface of the substrate, is disposed on a further similar substrate such as shown in FIG. 2 in a top to bottom relation while in the green state but with conductors formed thereon of the type noted hereinabove. With the two substrates in intimate contact, sintering is performed, whereby the substrates are joined with buried conductors therebetween. The substrates could also be joined by other means, such as an epoxy or the like. The number of substrates stacked one atop the other in this manner can be quite large.

A further manner of forming multiple substrates secured to each other is in the molding itself. A substrate of the type shown in FIG. 3 is first molded and, while in the "green" state, appropriate conductive insulative or other materials are deposited on one surface and in grooves and depressions therein by conventional techniques or by a further molding step. In accordance with the further molding step, the already molded "green" substrate is placed in a mold and the additional material or materials are molded thereon at predetermined locations and in predetermined grooves and depressions. Plural different materials can be simultaneously or serially molded onto the "green" substrate by well known techniques. In this way, conductors, insulators, semiconductors and other devices are formed on the "green" substrate. A third molding step would involve placing the "green" substrate with materials thereon into a mold and molding a further substrate over the materials, thereby burying conductors, etc. between the two substrates. This procedure can be continued to provide the desired number of layers whereupon the entire module is then fired after binder removal in the manner described in the above noted patents. A multiple layer ceramic module is thereby produced. Components can further be formed on the exposed surfaces by one or more of the procedures described hereinabove. Encapsulation as described above can now also be performed.

Though the invention has been described with respect to a specific preferred embodiment thereof, many variations and modifications will imemdiately become apparent to those skilled in the art. It is therefore the intention that the appended claims be interpreted as broadly as possible in view of the prior art to include all such variations and modifications.

What is claimed is:

1. A method or producing ak multilayer ceramic substrate, comprising the steps of:
    (a) providing a mold cavity in the shape of a substrate having regions forming grooves and holes through said substrate,
    (b) forming a first green ceramic substrate in said mold containing said grooves and holes therein with a homogeneous composition containing a powdered ceramic material and a binder,
    (c) placing said green ceramic substrate in a second mold having a cavity defining said substrate and a pattern on said substrate,
    (d) forming a green pattern on said substrate and in said holes and grooves in said second mold with a homogeneous material containing a powder and a binder to form a molded green member,
    (e) placing the molded green member from step (d) in a third mold having a cavity defining said substrate, said pattern thereon and a further substrate having at least one of grooves therein and holes therethrough,
    (f) forming a second green ceramic substrate with a homogeneous composition containing a powdered ceramic material and a binder in said third mold intimate with said pattern and said first green ceramic substrate to bury said pattern between said substrates and form a green product,
    (g) removing the binder from the green product of step (f), and
    (h) sintering the product of step (g).

2. A method as set forth in claim 1 wherein said powder in step (d) is electrically conductive.

3. A method as set forth in claim 1 wherein said mold cavity in at least one of steps (a) and (e) defines wells in a surface of at least one of said substrates.

4. A method as set forth in claim 1 further including the step of forming electrically conductive paths on a surface of at least one of said substrates remote from the pattern.

* * * * *